(12) United States Patent
Nomura et al.

(10) Patent No.: US 8,578,318 B2
(45) Date of Patent: Nov. 5, 2013

(54) METHOD FOR IMPLEMENTING CIRCUIT DESIGN FOR INTEGRATED CIRCUIT AND COMPUTER READABLE MEDIUM

(75) Inventors: Kumiko Nomura, Tokyo (JP); Shinichi Yasuda, Tokyo (JP); Shinobu Fujita, Inagi (JP); Keiko Abe, Yokohama (JP); Tetsufumi Tanamoto, Kawasaki (JP); Kazutaka Ikegami, Kawasaki (JP); Masato Oda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/561,483

(22) Filed: Jul. 30, 2012

(65) Prior Publication Data
US 2013/0055189 A1 Feb. 28, 2013

(30) Foreign Application Priority Data
Aug. 24, 2011 (JP) ................. 2011-182833

(51) Int. Cl.
*G06F 17/50* (2006.01)
(52) U.S. Cl.
CPC ........ *G06F 17/5077* (2013.01); *G06F 17/5081* (2013.01); *G06F 17/5031* (2013.01)
USPC ........... 716/130; 716/128; 716/129; 716/111; 716/132; 703/16
(58) Field of Classification Search
CPC ............ G06F 17/5077; G06F 17/5081; G06F 17/5031
USPC ............. 716/130, 129, 128, 111, 132; 703/16
See application file for complete search history.

(56) References Cited

U.S. PATENT DOCUMENTS 5,553,000 A * 9/1996 Dey et al. ............. 716/103
5,663,888 A * 9/1997 Chakradhar ........... 716/104
5,666,290 A * 9/1997 Li et al. ................ 716/113
(Continued)

FOREIGN PATENT DOCUMENTS

WO WO 2005/081142 A1 9/2005
WO WO 2008/146356 A1 12/2008

OTHER PUBLICATIONS

Poon et al.; "A Detailed Power Model for Field Programmable Gate Arrays", ACM Trans. on Design Automation of Electronic Systems, vol. 10, No. 2., 28 sheets, (2005).

(Continued)

*Primary Examiner* — Phallaka Kik
(74) *Attorney, Agent, or Firm* — Finnegan, Henderson, Farabow, Garrett & Dunner, L.L.P.

(57) ABSTRACT

In one embodiment, a method for implementing a circuit design for an integrated circuit includes: (a) obtaining a first wiring to satisfy a given operating frequency; (b) calculating a maximum bypass wiring length based on the given operating frequency and a critical path of the first wiring; (c) obtaining a second wiring by bypassing the first wiring using wires other than wires of the first wiring in a first wiring group, wherein wiring of the integrated circuit is categorized into a plurality of wiring groups, and the first wiring is included in the first wiring group of the categorized wiring groups; and (d) replacing the first wiring with the second wiring, if a difference between the second wiring and the first wiring is not larger than the maximum bypass wiring length, and not replacing the first wiring if said difference is larger than the maximum bypass wiring length.

8 Claims, 12 Drawing Sheets

(56) References Cited

U.S. PATENT DOCUMENTS

| | | | |
|---|---|---|---|
| 6,026,225 A * | 2/2000 | Iwasaki | 716/112 |
| 6,766,499 B1 * | 7/2004 | Mbouombouo et al. | 716/114 |
| 7,039,891 B2 * | 5/2006 | Tetelbaum | 716/113 |
| 7,281,233 B1 | 10/2007 | Sivasubramaniam | |
| 7,363,599 B1 * | 4/2008 | Vogenthaler | 716/102 |
| 7,464,286 B1 * | 12/2008 | Singh et al. | 713/503 |
| 7,493,578 B1 * | 2/2009 | Milne et al. | 716/106 |
| 2003/0229873 A1 * | 12/2003 | Casavant | 716/6 |
| 2006/0026539 A1 * | 2/2006 | Tetelbaum et al. | 716/2 |
| 2006/0162960 A1 * | 7/2006 | Montgomery et al. | 174/262 |
| 2007/0220466 A1 * | 9/2007 | Davidovic | 716/6 |
| 2009/0183132 A1 * | 7/2009 | Izuha et al. | 716/10 |
| 2010/0251191 A1 * | 9/2010 | Suaya et al. | 716/4 |

OTHER PUBLICATIONS

Notice of Preliminary Rejection issued by the Korean Intellectual Property Office on Jul. 30, 2013, for Korean Patent Application No. 10-2012-0082378, and English-language translation thereof.

* cited by examiner

US 8,578,318 B2

METHOD FOR IMPLEMENTING CIRCUIT DESIGN FOR INTEGRATED CIRCUIT AND COMPUTER READABLE MEDIUM

CROSS-REFERENCE TO RELATED APPLICATION

This application claims priority from Japanese Patent Application No. 2011-182833, filed on Aug. 24, 2011, the entire contents of which are hereby incorporated by reference.

BACKGROUND

1. Field

Embodiments described herein relate to a method for implementing a circuit design for an integrated circuit, and a computer-readable medium.

2. Description of the Related Art

An FPGA (Field Programmable Gate Array) is a kind of integrated circuit in which a user can write a logical circuit of user's own to achieve operation desired by the user. An internal circuit in the FPGA can be rewritten even after it is shipped as a product. In order to implement wiring for connecting logical blocks placed in a related-art FPGA layout, a plurality of wires selected in advance are used for the wiring to make the wiring length among the logical blocks the shortest, that is, to make the operating frequency the highest. When the performance (operating frequency) requested by the user is satisfied, the wiring arranged thus is used. Otherwise, wiring is tried again from the step of selecting wires.

In the FPGA arranged and wired thus, there may be a large number of wires or logical blocks that are not used as a circuit, differently from an ASIC (Application Specific Integrated Circuit). A current flows into such a wire or a logical block though the wire or the logical block is not used. Thus, there is a problem that total power consumption (particularly, static power consumption) of the FPGA increases.

[Non-Patent Document 1] KARA K. W. POON, STEVEN J. E. Wilton, and Andy YAN, "A Detailed Power Model for Field-Programmable Gate Arrays", ACM Trans. on Design Automation of Electronic Systems, Vol. 10, No 2, April 2005.

[Patent Document 1] U.S. Pat. No. 7,281,233

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

According to an embodiment, there is provided a method for implementing a circuit design for an integrated circuit. The method includes: (a) obtaining a first wiring to satisfy a given operating frequency; (b) calculating a maximum bypass wiring length based on the given operating frequency and a critical path of the first wiring; (c) obtaining a second wiring by bypassing the first wiring using wires other than wires of the first wiring in a first wiring group including the first wiring, wherein wiring of the integrated circuit is categorized into a plurality of wiring groups, and the first wiring is included in the first wiring group of the categorized wiring groups; and (d) replacing the first wiring with the second wiring, if a difference between the second wiring and the first wiring is not larger than the maximum bypass wiring length, and not replacing the first wiring with the second wiring if said difference is larger than the maximum bypass wiring length.

Figure 1:
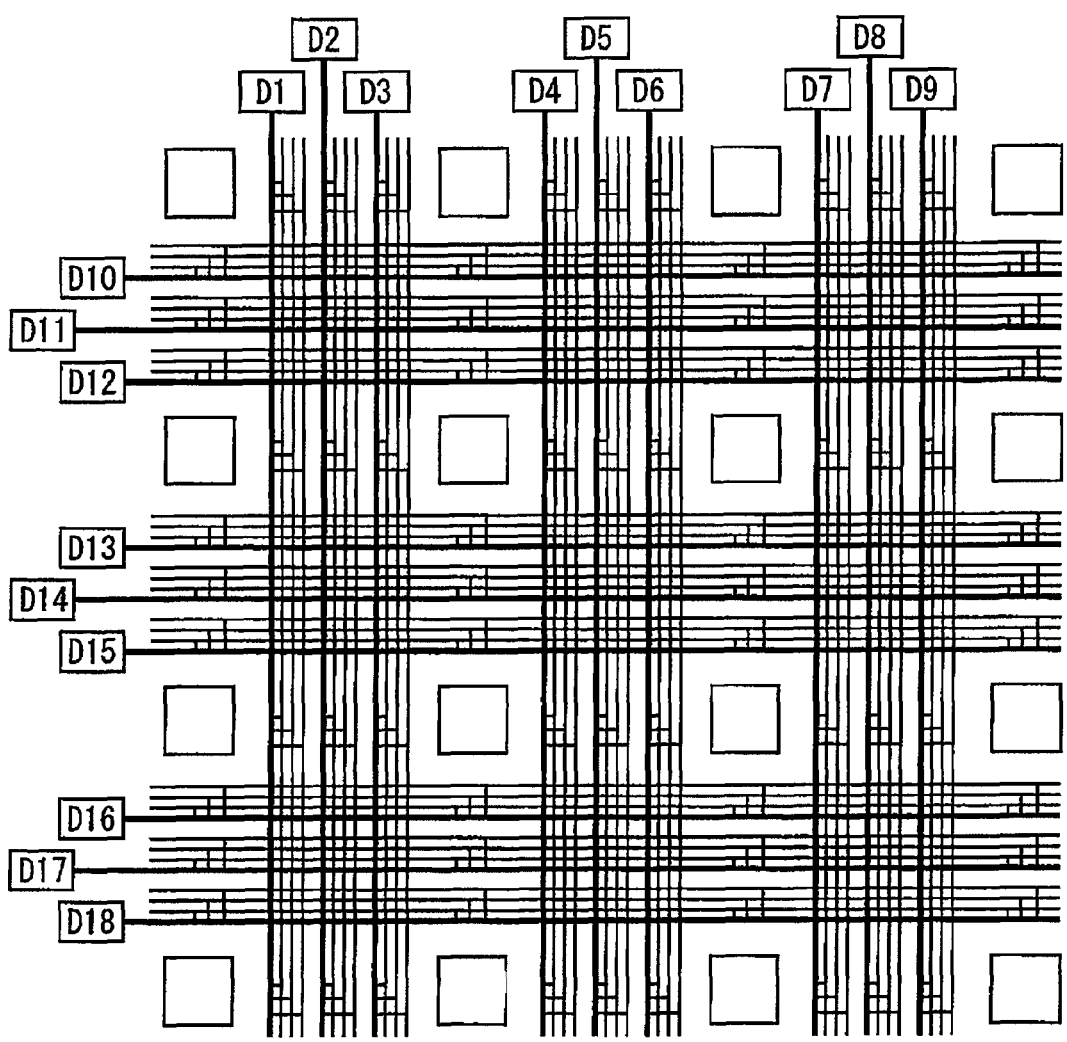
FIG. 1 is a diagram showing the concept of an FPGA according to an embodiment.

An embodiment of the invention will be described below with reference to the drawings. FIG. 1 is a diagram showing the concept of an FPGA according to the embodiment. In the FPGA according to the embodiment, wires belonging to the FPGA are divided into some groups (hereinafter referred to wiring groups). Powering on/off of a plurality (regarded as n) of wires belonging to one wiring group is controlled by a signal outputted from one memory. In FIG. 1, illustration is made in such a manner that the number of wires belonging to each wiring group is the same. In fact, however, the number of wires may differ from one wiring group to another. FIG. 1 shows a state where the wiring groups of the FPGA are connected to control wires to which memories D1 to D18 are connected. Volatile memories such as SRAMs or nonvolatile memories such as DRAMs may be used as the memories D1 to D18. When nonvolatile memories are used, information can be held even if the FPGA as a whole is powered off. Thus, the information does not have to be written again so that the power consumption can be suppressed to be lower than that of volatile memories.

With this configuration, if a plurality of wires belonging to a wiring group are not used for the operation of the FPGA, the wiring group can be powered off. In the FPGA, the power consumption of a wiring portion is so high that the static power consumption can be saved if unused wiring groups are powered off. In addition, power supply to a plurality of wires is managed by one memory in the FPGA according to the embodiment. Thus, as compared with the case where one memory is provided for each wire, the number of memories can be reduced so that increase of the area where the memories are placed can be suppressed.

Figure 2:
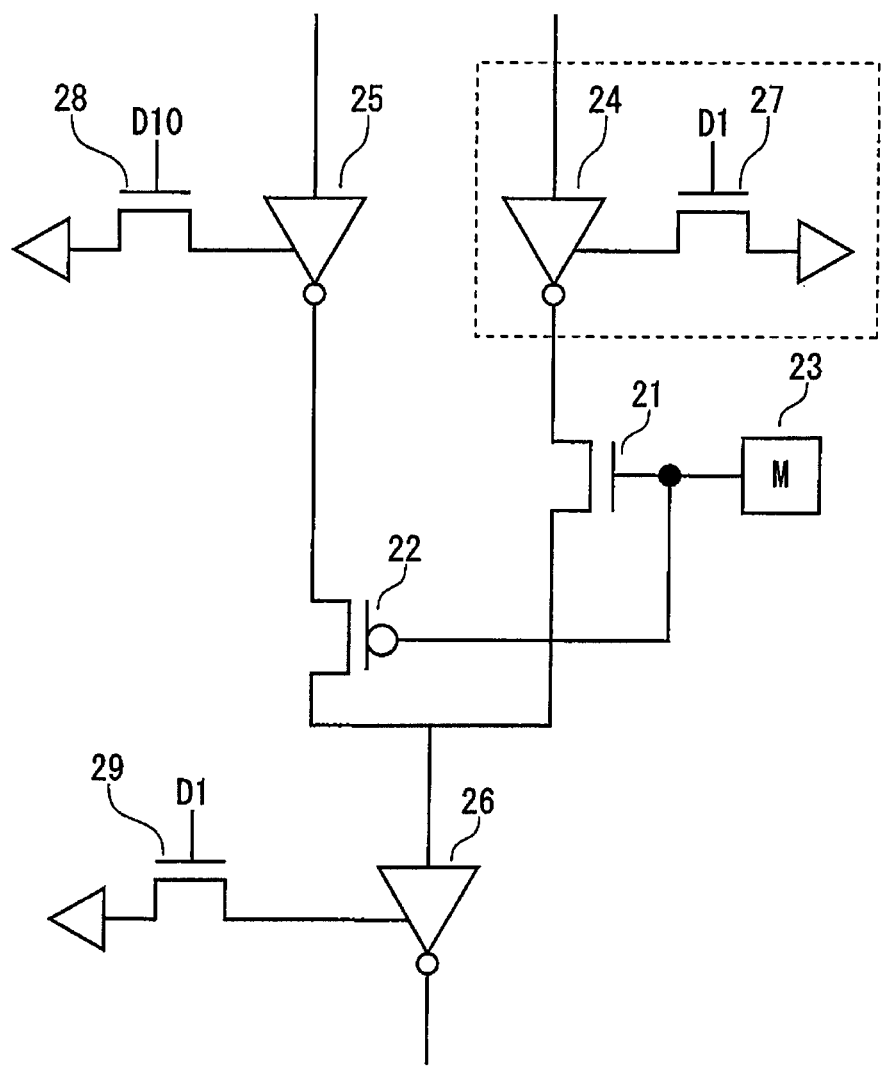
FIG. 2 is a diagram showing an example of a circuit for controlling power supply to wiring according to the embodiment.

FIG. 2 is a diagram showing an example of a circuit for controlling power supply to wires (an example of a circuit which is connected to the memory D1). For example, a two-input multiplexer as shown in FIG. 2 is used in a switch portion on the FPGA. Due to the multiplexer, for example, a wire controlled by the memory D10 can be connected to a wire controlled by the memory D1. Thus, a path can be changed over to another wire. The two-input multiplexer outputs a signal from a wire inputted to an N-type MOSFET 21 or a P-type MOSFET 22 selected in accordance with an output from a memory 23 for controlling the FPGA. In the example of FIG. 2, assume that the signal from the wire controlled by the memory D10 is inputted to the N-type MOSFET 21 while the signal from the wire controlled by the memory D1 is inputted to the P-type MOSFET 22. In addition, the two-input multiplexer is provided with inverters 24 to 26 for signal amplification. Transistors 27 to 29 each of which can be turned ON/OFF by an output signal from the memory D1 or the memory D10 are provided for the inverters 24 to 26 respectively. Although FIG. 2 depicts a circuit as a multiplexer provided for one wire belonging to a wire group, similar transistor circuits are provided for all the inverters provided for all the wires connected to one and the same memory D1.

Figure 3A:
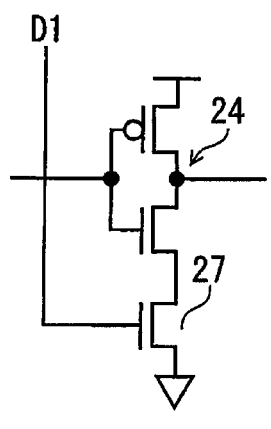
FIGS. 3A-3C are diagrams each showing a connection portion between an inverter and a transistor according to the embodiment in detail.
Figure 3B:
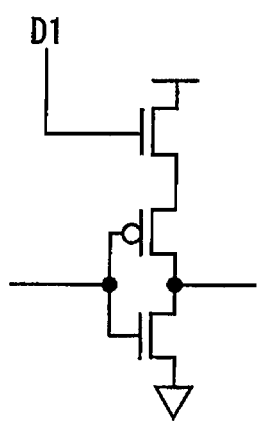
Figure 3C:
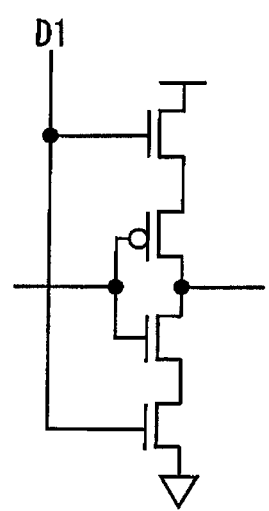

FIG. 3 is a diagram showing in detail a connection portion (surrounded by a broken line in FIG. 2) between the inverter 24 and the transistor 27 in FIG. 2. The connection portion between the inverter 24 and the transistor 27 is formed, for example, as shown in any one of FIGS. 3A to 3C. FIGS. 3A and 3B show circuits in which one transistor 27 is connected to one end of either an N-type MOSFET or a P-type MOSFET constituting the inverter 24. FIG. 3C shows a circuit in which one transistor 27 is connected to one end of an N-type MOSFET constituting the inverter 24 while another transistor 27 is connected to one end of a P-type MOSFET constituting the inverter 24.

When the transistor 27 connected to the inverter 24 is set to be OFF in accordance with an output signal from the memory D1, the current flowing in the inverter can be blocked. Particularly in the circuit shown in FIG. 3C, the required number of transistors 27 is indeed larger than that in FIG. 3A or 3B by one, but ON/OFF of power supply to the wire to which the inverter 24 is connected can be set more stably. A connection portion between the inverter 25 and the transistor 28 or a connection portion between the inverter 26 and the transistor 29 in FIG. 2 may be also formed by the circuit described with reference to FIG. 3A to FIG. 3C.

Figure 4:
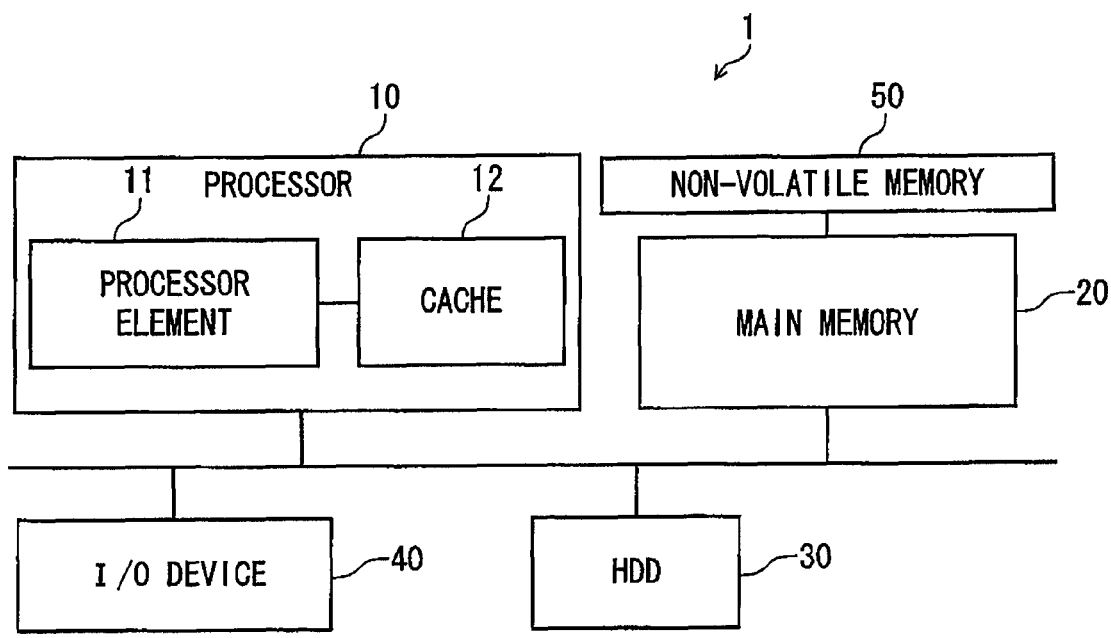
FIG. 4 is a block diagram of a PC for performing arrangement and wiring on the FPGA according to the embodiment.

Next, description will be made on the arrangement and wiring of the FPGA described with reference to FIGS. 1, 2 and 3A-3C. The arrangement and wiring of the FPGA according to the embodiment is, for example, performed by a personal computer (PC). FIG. 4 is a block diagram of a PC 1 for performing arrangement and wiring on the FPGA. In the PC 1, a processor 10, a main memory 20, a hard disk 30 and an input/output (I/O) device 40 are connected through an internal interface. In addition, a nonvolatile memory 50 is connected to the main memory 20. The processor 10 has a processor element 11 for performing arithmetic processing and a cache 12. The processor 10 controls the PC 1 as a whole. The I/O device 40 is connected to various external devices and, for example, used for outputting information about arrangement and wiring in order to write the information about the arrangement and wiring into the FPGA. A program for the arrangement and wiring on the FPGA is, for example, stored in the hard disk 30, and executed as follows. That is, the main memory 20 reads the program, and the processor element 11 performs operation in accordance with the program read in the main memory 20. The program for the arrangement and wiring on the FPGA to be stored in the hard disk 30 may be acquired through the I/O device 40 from a storage medium (such as a recordable CD/DVD or a USB memory) storing the program, or through a not-shown antenna from a server storing the program.

Figure 5:
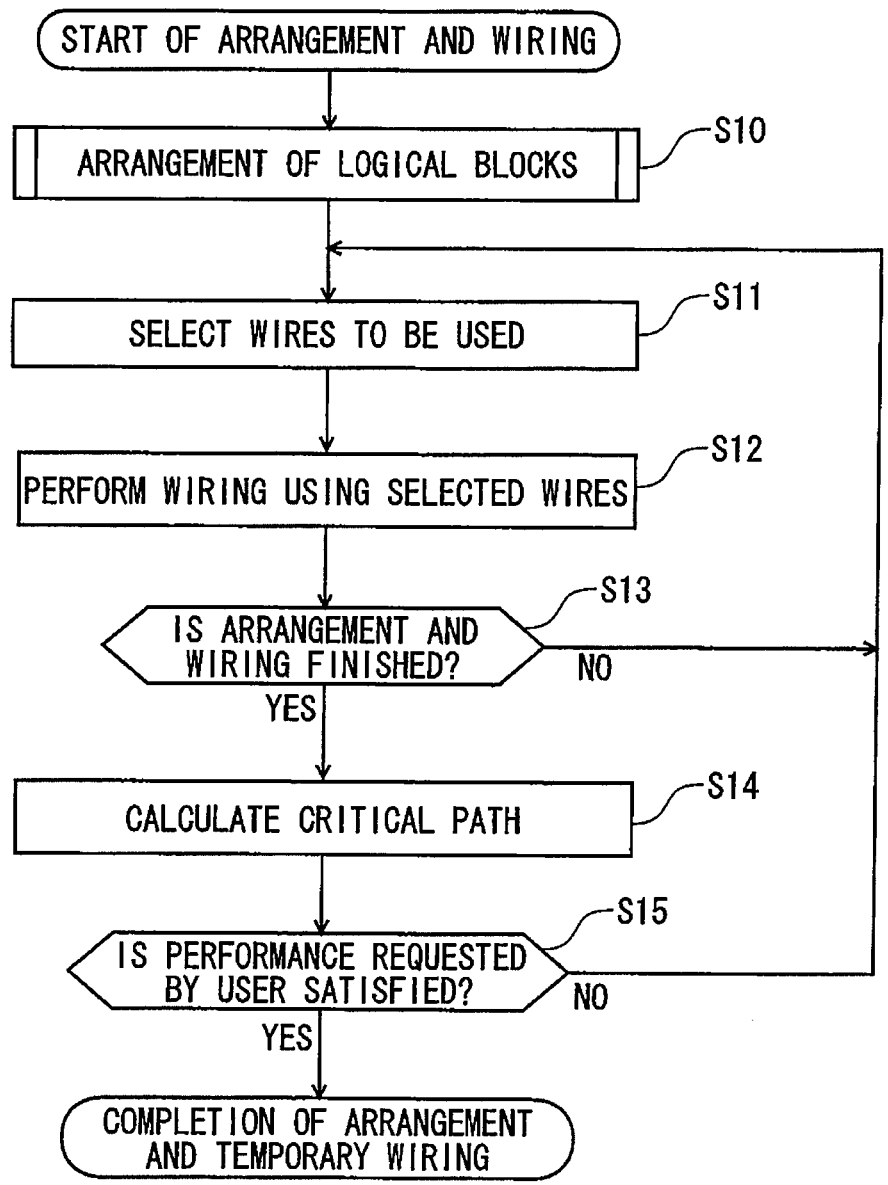
FIG. 5 is a flow chart showing arrangement and wiring on the FPGA according to the embodiment.
Figure 6:
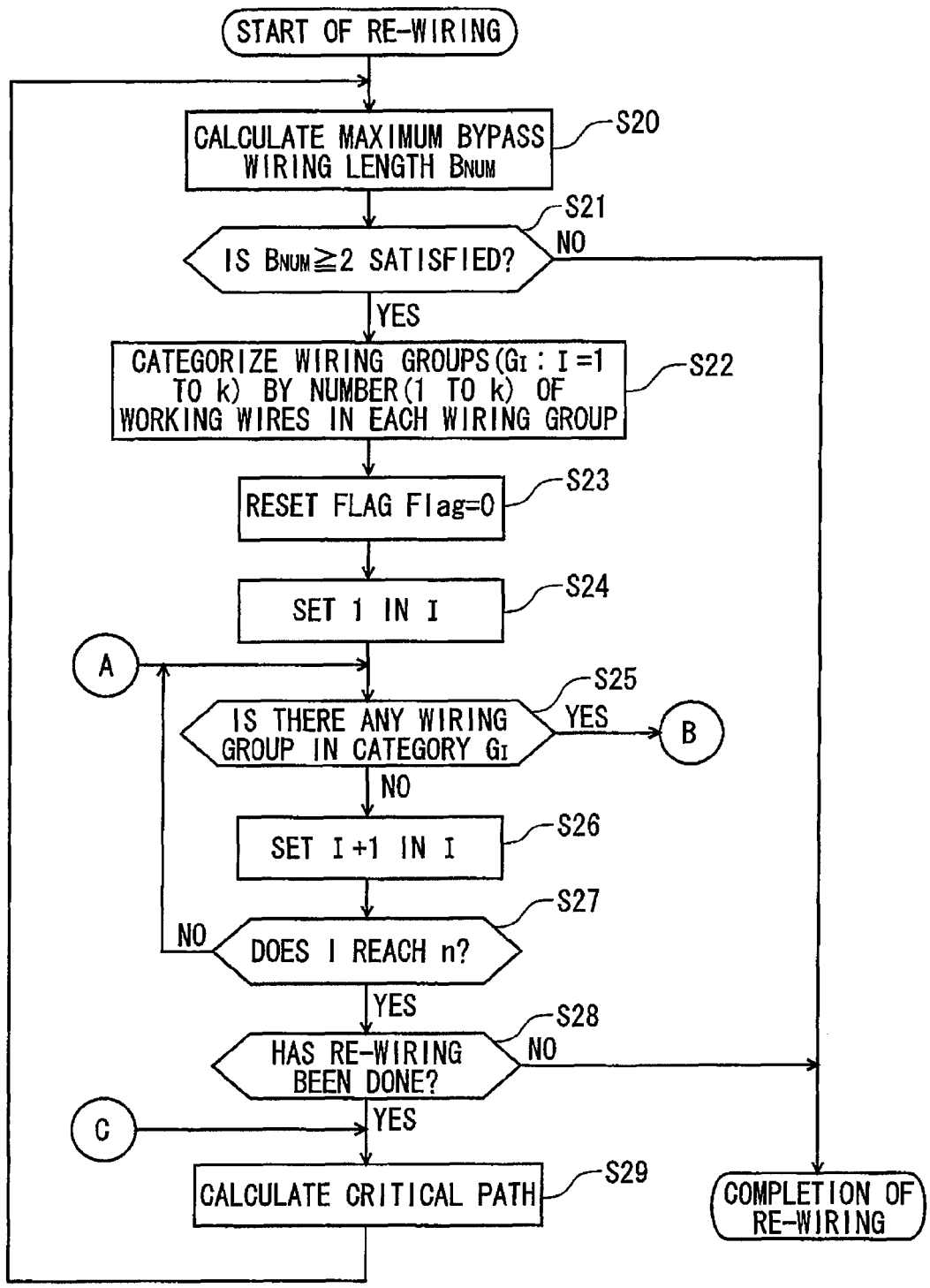
FIG. 6 is a flow chart showing the arrangement and wiring on the FPGA according to the embodiment.
Figure 7:
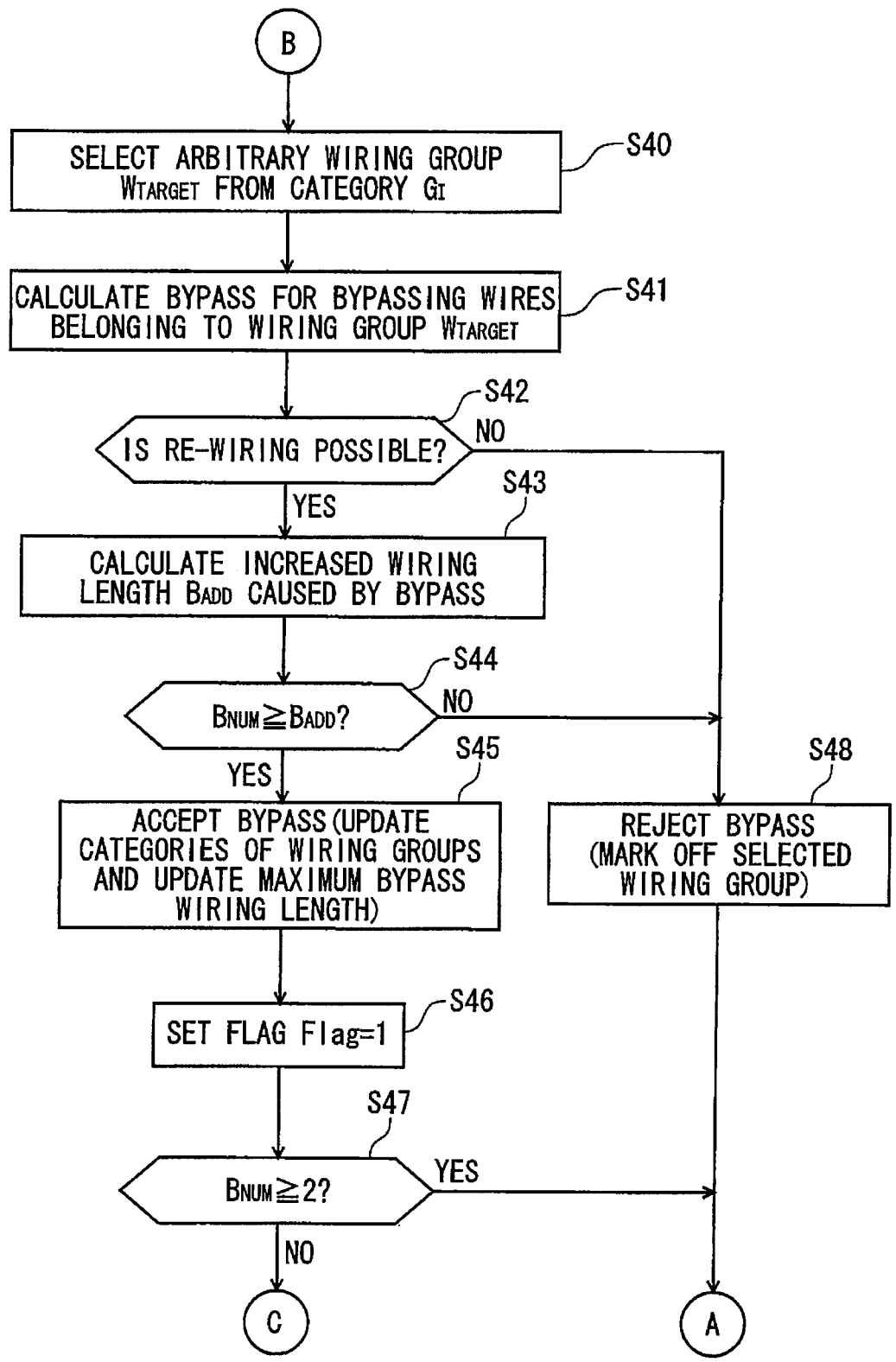
FIG. 7 is a flow chart showing the arrangement and wiring on the FPGA according to the embodiment.

The arrangement and wiring on the FPGA according to the embodiment is achieved by the processor element 11 executing processes in FIGS. 5 to 7. The processor element 11 carries out the process shown in FIG. 5 so as to perform arrangement and temporary wiring to satisfy performance requested by a user. The processor element 11 carries out the processes shown in FIGS. 6 and 7 so as to change the temporary wiring while satisfying the performance requested by the user. Thus, the processor element 11 achieves wiring by which more wires can be powered off.

Description will be made on the process shown in FIG. 5. Since processing in each step of a processing flow for temporary wiring shown in FIG. 5 has been described in Non-Patent Document 1, detailed description thereof will be omitted. The processor element 11 arranges logical blocks for achieving a circuit desired by a user (S10). Then, the processor element 11 selects a plurality of wires (S11), and performs wiring for connecting the logical blocks arranged in Step S10 using the selected wires (S12).

On completing the wiring using the selected wires (Yes in S13), the processor element 11 calculates a critical path of the created arrangement and wiring (S14). Based on the calculated critical path, the processor element 11 obtains a maximum operating frequency of the created arrangement and wiring and determines whether the created arrangement and wiring satisfies a given operating frequency requested by the user (hereinafter referred to as a requested frequency) or not (S15). When it is concluded in Step S15 that the created arrangement and wiring does not satisfy the requested frequency (No in S15), the processor element 11 returns to Step S11 and redoes wiring. On the contrary, when the arrangement and wiring satisfying the requested frequency can be created (Yes in S15), the processor element 11 terminates the temporary wiring process shown in FIG. 5. Hereinafter, the wires used in the created arrangement and wiring will be referred to as wires used for the layout.

Next, description will be made on the process shown in FIGS. 6 and 7. Although arrangement and wiring satisfying the requested frequency can be obtained in the temporary wiring process, no consideration is made about reduction in power consumption of wires. Therefore, on terminating the temporary wiring process shown in FIG. 5, the processor element 11 starts a re-wiring process shown in FIGS. 6 and 7.

The processor element 11 first calculates a wiring length with which the critical path of current wiring can be bypassed to the greatest possible extent as long as the requested frequency is satisfied (S20). The bypass wiring length $B_{NUM}$ is, for example, calculated by Expression (1).

$$B_{NUM} = (1/f_R - D_{PATH}) D_{CLB} \qquad (1)$$

Here, $D_{PATH}$ designates a delay time generated due to the critical path $C_{PATH}$, and $D_{CLB}$ designates a delay time generated due to wiring corresponding to the length of one side of a logical block. That is, the bypass wiring length $B_{NUM}$ shows how many logical block sides of wiring can be bypassed by bypassing the wiring from the critical path $C_{PATH}$ of the current wiring as long as the performance requested by the user is satisfied.

The bypass wiring length $B_{NUM}$ calculating method is not limited to Expression (1) but may be another calculation method using the performance requested by the user and the critical path. For example, the calculation method as shown in Expression (2) may be considered.

$$B_{NUM} = (L_{MAX} - L_C)/L_{CLB} \qquad (2)$$

in which $L_{MAX}$ designates a maximum wiring length satisfying the requested frequency $f_R$, $L_C$ designates the length of the critical path $C_{PATH}$ and $L_{CLB}$ designates the length of one side of a logical block.

Figure 8A:
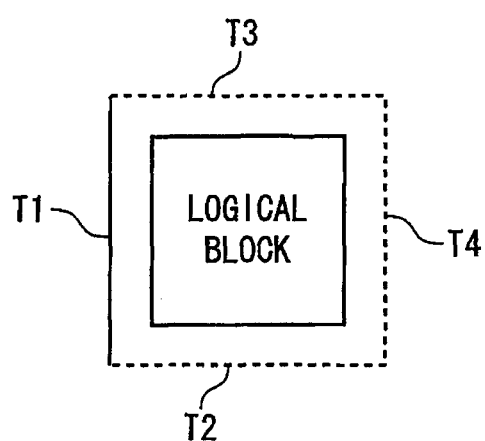
FIGS. 8A-8B are views each showing wires required for bypassing a wire.
Figure 8B:
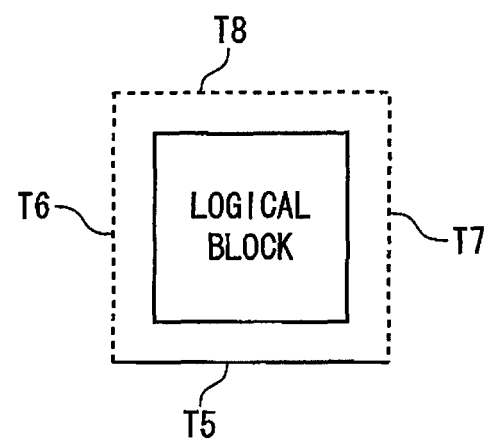

The processor element 11 determines whether the bypass wiring length $B_{NUM}$ calculated thus is at least 2 or not (S21). In order to bypass a wire T1 corresponding to one side of a logical block and placed in the vertical direction thereof as shown in FIG. 8A, it is necessary to prepare at least horizontal wires T2 and T3 corresponding to two sides of the logical block and a vertical wire T4 corresponding to one side of the logical block. Similarly, in order to bypass a wire T5 corresponding to one side of a logical block and placed in the horizontal direction thereof as shown in FIG. 8B, it is necessary to prepare at least vertical wires T6 and T7 corresponding to two sides of the logical block and a horizontal wire T8 corresponding to one side of the logical block. That is, it means that in order to bypass a wire in the critical path $C_{PATH}$, the wiring length increases at least by two sides of a logical block.

When the bypass wiring length $B_{NUM}$ is compared with 2, it is therefore possible to determine whether a wire can be bypassed while satisfying the performance requested by the user or not. When the bypass wiring length $B_{NUM}$ is smaller than 2 (No in S21), the wiring process is terminated. If whether a wire can be bypassed while satisfying the performance requested by the user or not can be determined thus in advance, it is possible to avoid a wasteful process of attempt to bypass a wire although the performance requested by the user cannot be satisfied.

When it is concluded in Step S21 that the bypass wiring length $B_{NUM}$ is not smaller than 2, the processor element 11 categorizes each wiring group by the number of wires used for the layout in the wiring group (S22). That is, each wiring group is categorized as a wiring group in which, of k wires belonging to the wiring group, i wires ($0 \leq i \leq n$) are used for the layout (hereinafter referred to as working wires). The processor element 11 then resets a flag serving to determine whether re-wiring has been performed or not (as will be described later in S28) (S23).

The processor element 11 selects a category $G_1$ in which the number of working wires is one (S24). When there is any wiring group in the category $G_1$ (Yes in S25), the processor element 11 moves to the flow chart shown in FIG. 7. When there is no wiring group (No in S25), the processor element 11 selects a category in which the number of working wires is one larger than that of the currently selected category, and repeats the processing of Step S25 until the variable I reaches n.

When it is concluded in Step S25 that there is any wiring group in a category $G_I$, the processor element 11 selects an arbitrary wiring group $W_{TARGET}$ from the category $G_I$ (S40). Then, the processor element 11 calculates a bypass using wires of wiring groups whose numbers of working wires range from one to n, so as to bypass each of the I wires belonging to the wiring group $W_{TARGET}$ and used for the layout (S41). When a plurality of bypasses are calculated in Step S41, the shortest bypass is selected.

When all the working wires belonging to the wiring group $W_{TARGET}$ can be bypassed by other wiring groups than the wiring group $W_{TARGET}$ (Yes in S42), the processor element 11 calculates an increased wiring length $B_{ADD}$ after bypassing relative to the original wiring (S43). The $B_{ADD}$ indicating the increased wiring length is calculated as a value indicating a length corresponding to the number of logical block sides so that the increased wiring length $B_{ADD}$ can be compared with the bypass wiring length $B_{NUM}$. The invention is not limited thereto, but it will go well as long as the units of the wiring lengths $B_{ADD}$ and $B_{NUM}$ are coordinated with each other so that the wiring lengths $B_{ADD}$ and $B_{NUM}$ can be compared with each other.

When the increased wiring length $B_{ADD}$ is shorter than the maximum bypass wiring length $B_{NUM}$ (Yes in S44), it is ensured that the wiring after bypassing satisfies the requested frequency. Therefore, the processor element 11 accepts the wiring after bypassing (S45). When the wring after bypassing is accepted, the category of the wiring group $W_{TARGET}$ is changed into the category whose number of working wires is 0, and the value of the maximum bypass wiring length $B_{NUM}$ is updated, as shown in Expression (3). Further, categories of wiring groups including wires used for bypassing the wires of the wiring group $W_{TARGET}$ are changed in accordance with the number of working wires where the bypass wiring has been accepted.

$$G_0 = G_0 U\{W_{TARGET}\}$$

$$G_1 = G_I - \{W_{TARGET}\}$$

$$B_{NUM} = B_{NUM} - B_{ADD} \quad (3)$$

When processing for accepting the bypass is completed in Step S45, the processor element 11 sets the flag indicating that re-wiring has been done (S46). When the maximum bypass wiring length $B_{NUM}$ is smaller than 2 (No in S47), it is impossible to bypass any more wires. Therefore, the processor element 11 calculates a critical path after the re-wiring in Step S29 of FIG. 6, and repeats processing on and after Step S20. On the contrary, when the maximum bypass wiring length $B_{NUM}$ is at least 2 (Yes in S47), the processor element 11 returns to Step S25 and performs processing for re-wiring on wiring groups belonging to the category $G_I$.

When the increased wiring length $B_{ADD}$ is longer than the maximum bypass wiring length $B_{NUM}$ in Step S44 (No in S44) or when at least one working wire of the working wires of the wiring group $W_{TARGET}$ cannot be bypassed (No in S42), the wiring after bypassing is rejected (S48). When the wiring after bypassing is rejected, information for determining that the wiring group $W_{TARGET}$ has been processed is provided. For example, a category $G_{FINISH}$ indicating processed wiring groups is provided, and the wiring group $W_{TARGET}$ is moved to the category $G_{FINISH}$ to be determined as processed as expressed in Expression (4).

$$G_{FINISH} = G_{FINISH} U\{W_{TARGET}\}$$

$$G_I = G_I - \{W_{TARGET}\} \quad (4)$$

When the processing of Step S48 is completed, the processor element 11 returns to Step S25 and performs processing for re-wiring on wiring groups belonging to the category $G_I$. When processing for re-wiring all over the wiring groups belonging to all the categories $G_1$ to $G_{n-1}$ is completed in the state where the maximum bypass wiring length $B_{NUM}$ is at least 2 (Yes in S27), it is determined in Step S28 whether bypass wiring is accepted or not. When the bypass wiring is rejected (No in S28), the wiring process is terminated. Whether the bypass wiring is accepted or not can be determined based on the flag indicating that re-wiring has been done.

According to the aforementioned process, wiring in which the number of wiring groups having no wires used for the layout is increased and in which a requested frequency is satisfied can be obtained based on wiring satisfying the requested frequency.

In the embodiment, the re-wiring process is performed on wiring groups sequentially in ascending order of categories based on the number of working wires belonging thereto.

However, the order with which the re-wiring process should be performed is not limited thereto. For example, assume that the wiring groups are divided into three categories, i.e. a category of no working wires, a category of n working wires, and a category of one to (n−1) working wires. The re-wiring process may be performed in arbitrary order from any one of wiring groups belonging to the category of one to (n−1) working wires.

In the re-wiring process which has been described with reference to FIGS. 6 and 7, there are two conditions for terminating the process. That is, these two conditions are the case where the maximum bypass wiring length $B_{NUM}$ is smaller than 2 and the case where bypass wiring is rejected for any wiring group after the maximum bypass wiring length $B_{NUM}$ is calculated. However, some arranged wiring that is accepted may be not able to be re-arranged further even if the maximum bypass wiring length $B_{NUM}$ is not smaller than 2. Therefore, termination conditions as shown in the following Modifications 1 to 3 may be added to the aforementioned termination conditions. In the flow charts of the following modifications, the same processings as those described with reference to FIGS. 6 and 7 are given the same numerals correspondingly, and detailed description thereof will be omitted.

(Modification 1)

For example, assume that when the maximum bypass wiring length $B_{NUM}$ is 2, the number of working wires is at least 2 in any wiring group for which re-arrangement calculation has not been performed. In this case, even if one working wire can be bypassed, the other working wires cannot be bypassed. That is, when re-arrangement calculation is performed on wiring groups sequentially in ascending order of categories based on the number of working wires belonging thereto, all the working wires cannot be bypassed if the maximum bypass wiring length $B_{NUM}$ is smaller than 2×I (I designates the number of working wires).

Figure 9:
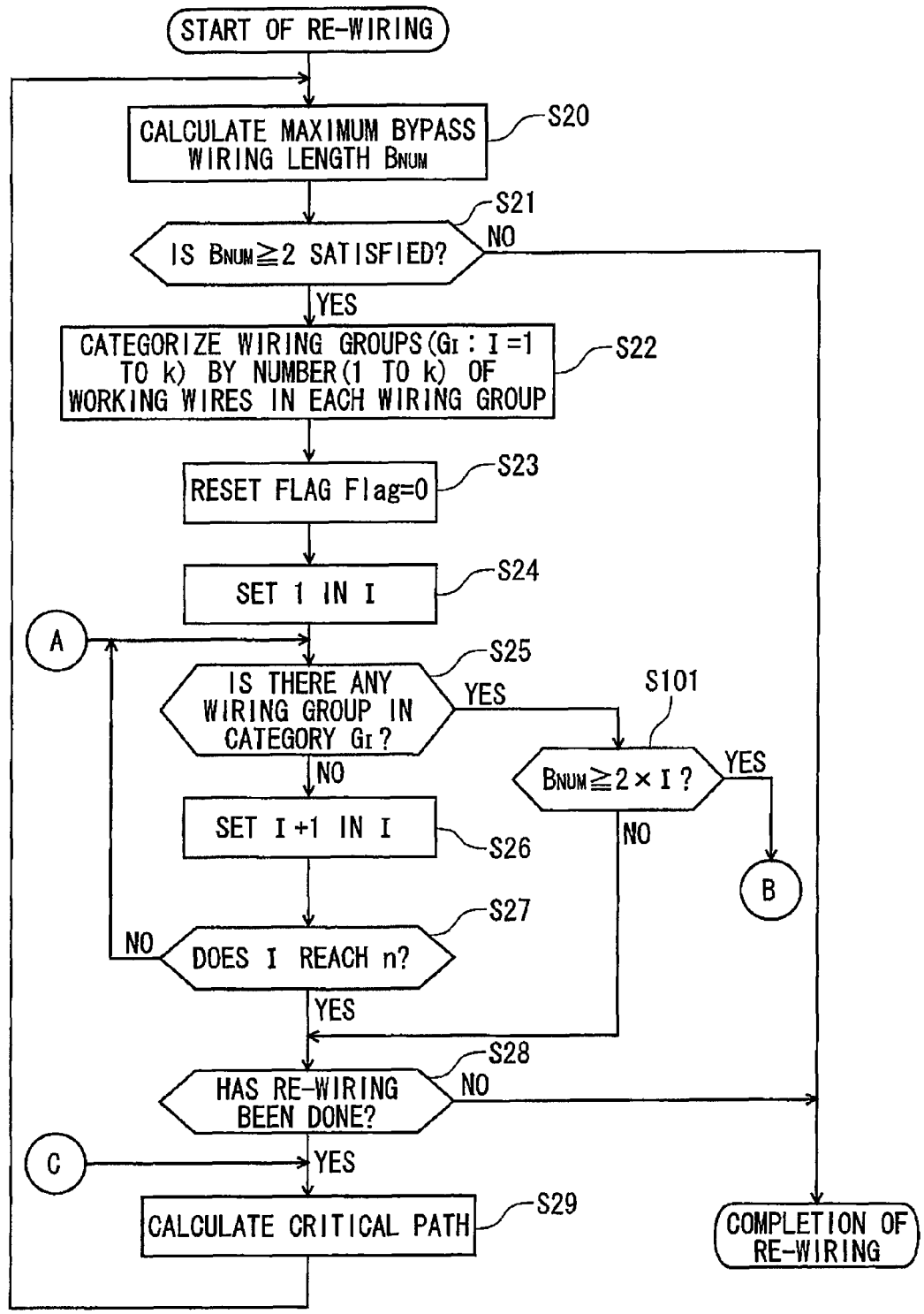
FIG. 9 is a flow chart showing arrangement and wiring on the FPGA according to Modification 1 of the embodiment.

Therefore, the process shown in FIG. 6 is replaced by that of FIG. 9, in which the maximum bypass wiring length $B_{NUM}$ is compared with 2×I (S101). When the maximum bypass wiring length $B_{NUM}$ is at least 2×I (Yes in S101), the flow of processing proceeds to Step S40, in which processing for rewiring the wiring groups in the category $G_I$ is performed. When the maximum bypass wiring length $B_{NUM}$ is smaller than 2×I (No in S101), the flow of processing goes to processing of Step S28. Thus, it is possible to prevent processing for attempt of re-arrangement from being performed when the re-arrangement cannot be achieved.

(Modification 2)

Figure 10:
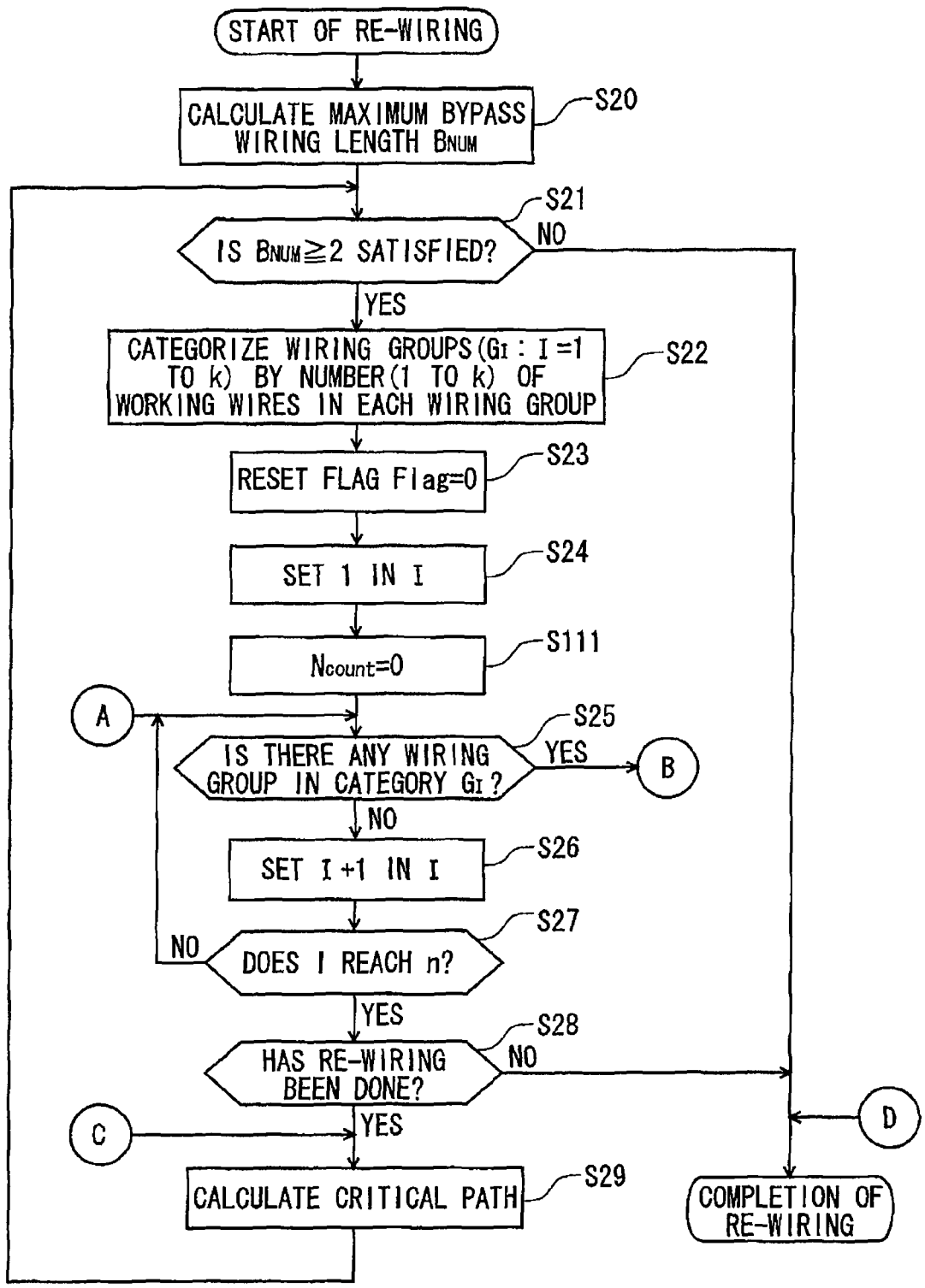
FIG. 10 is a flow chart showing arrangement and wiring on the FPGA according to Modification 2 of the embodiment.
Figure 11:
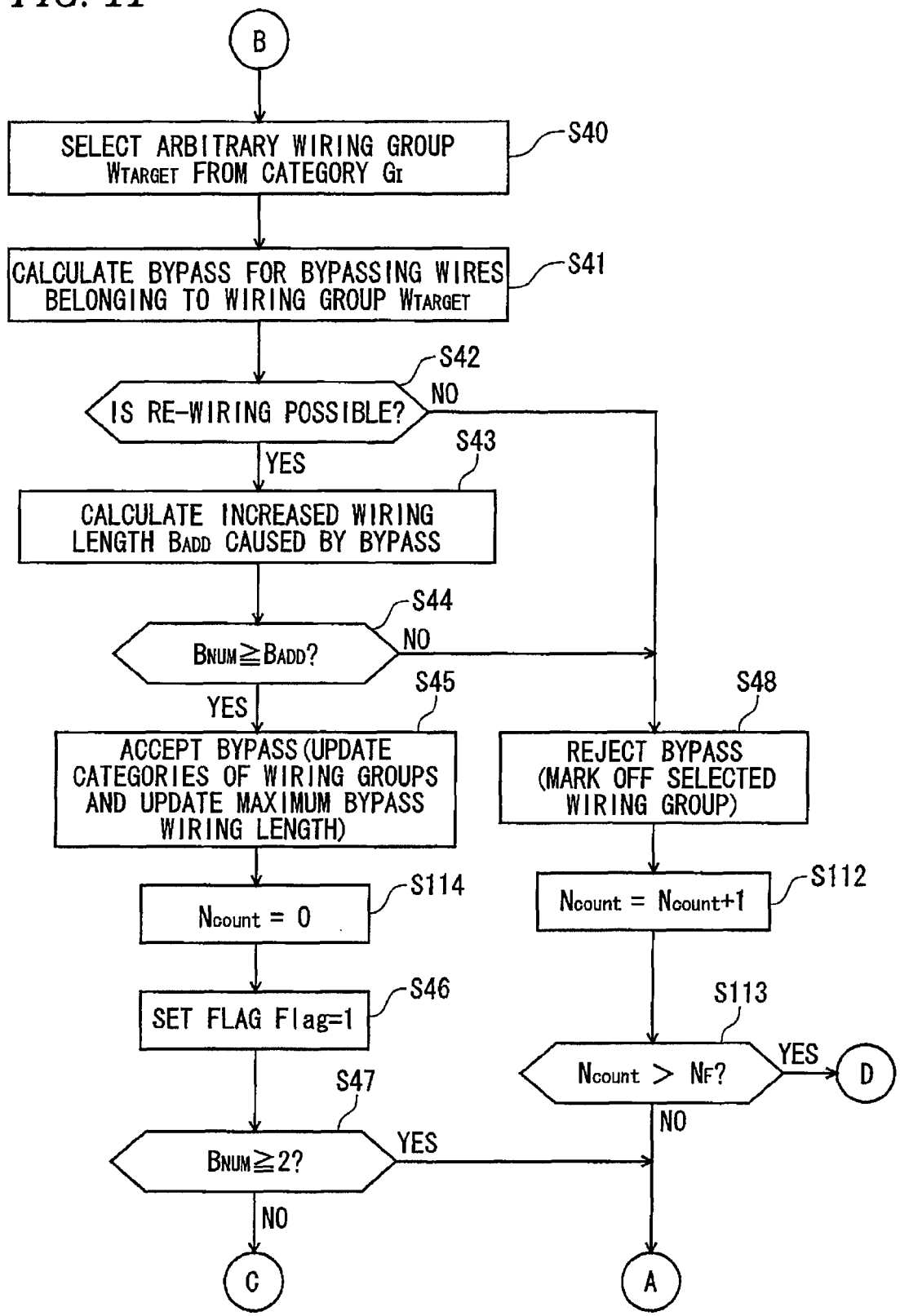
FIG. 11 is a flow chart showing the arrangement and wiring on the FPGA according to Modification 2 of the embodiment.

When bypass wiring is rejected successively many times, the wiring process may be terminated at that time. FIGS. 10 and 11 are flow charts showing a process in which the processor element 11 terminates the wiring process as soon as the number of times of bypass rejection exceeds a predetermined number ($N_F$ times).

In the process shown in FIGS. 10 and 11, a variable $N_{count}$ for counting the number of times of bypass rejection is used. The variable $N_{count}$ is reset to zero before the search of bypasses is performed (for example, Step S111 in FIG. 10). When a bypass is rejected in Step S48 of FIG. 11, the variable $N_{count}$ is incremented by one (S112). When the variable $N_{count}$ exceeds a threshold $N_F$ (Yes in S113), the wiring process is terminated. On the other hand, when the bypass is accepted in Step S45 of FIG. 11, the variable $N_{count}$ is reset to zero (S114).

(Modification 3)

Figure 12:
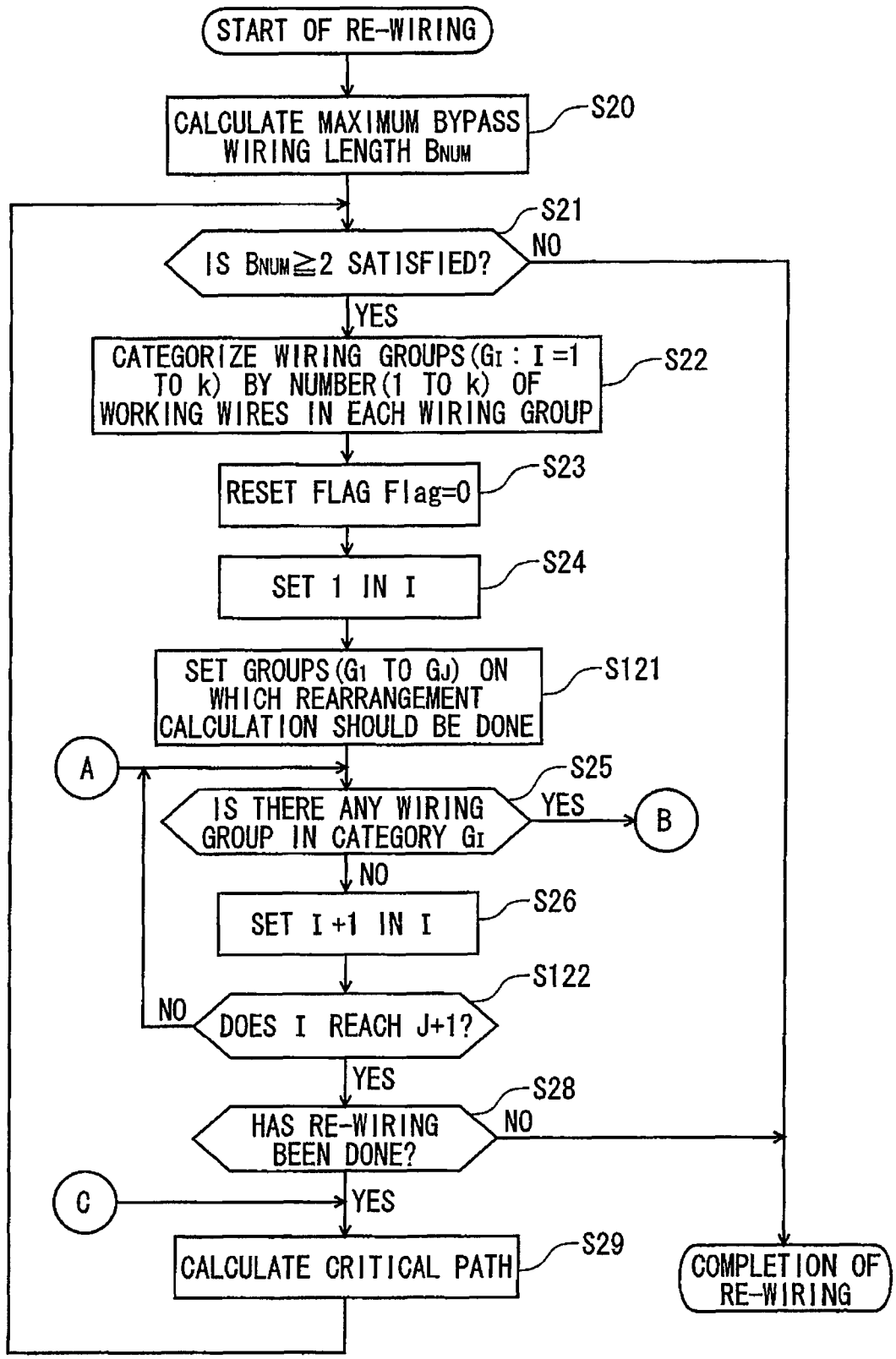
FIG. 12 is a flow chart showing arrangement and wiring on the FPGA according to Modification 3 of the embodiment.

A category as a target of re-arrangement calculation may be defined in advance. When re-arrangement calculation of wiring groups belonging to the category as a target of the re-arrangement calculation is completed, the process is terminated. To this end, the process shown in FIG. 6 is replaced by a process based on FIG. 12. In the process shown in FIG. 12, a category as a target of re-arrangement calculation is set before the re-arrangement calculation (for example, S121 in FIG. 12). Here, the largest number of working wires in categories which wiring groups that can be rewired belong to is calculated by Expression (5) and Expression (6).

$$\sum_{i=1}^{J}(2iC_i + iR_i) \le \sum_{i=J+1}^{n}(n-i)R_i \quad (5)$$

$$\sum_{i=1}^{J}(2iR_i + iC_i) \le \sum_{i=J+1}^{n}(n-i)C_i \quad (6)$$

in which $R_i$ designates the number of wiring groups each of which consists of horizontal wires and in which the number of working wires is i, and $C_i$ designates the number of wiring groups each of which consists of vertical wires and in which the number of working wires is i. The processor element 11 obtains a maximum number J of working wires in the category as a target of rewiring so as to satisfy Expression (5) and Expression (6).

When wires used for the layout in a wiring group are i vertical wires, 2×i horizontal wires and i vertical wires are required for bypass wiring. On the other hand, when wires used for the layout are i horizontal wires, i horizontal wires and 2×i vertical wires are required for bypass wiring.

The left part of Expression (5) designates the number of horizontal wires required for bypassing all the wires belonging to the wiring groups categorized into the category in which 1 to J wires are used for the layout in each wiring group. The right part of Expression (5) designates the total number of horizontal wires which are not used for the layout but which belong to wiring groups categorized into a category in which (J+1) to n wires are used for the layout in each wiring group. That is, in Expression (5), it is verified whether or not horizontal wires which can serve as bypass are sufficient to bypass all the wires belonging to the wiring groups categorized into the category in which 1 to J wires are used for the layout in each wiring group.

In the same manner, in Expression (6), it is verified whether or not vertical wires which can serve as bypass are sufficient to bypass all the wires belonging to the wiring groups categorized into the category in which 1 to J wires are used for the layout in each wiring group. Then, J satisfying Expression (5) and Expression (6) is searched for and the wiring groups each having 1 to J wires used for the layout are regarded as candidates for bypassing the wires.

When such a modification is used, it is possible to shorten the time required for the process of rewiring and obtain a wiring bypass in a shorter time. Some of Modifications 1 to 3 may be combined and used.

As described above, according to the configuration of the embodiment of the invention or its modification, it is possible to perform wiring to make the number of wiring groups having no wires used for the layout as large as possible while satisfying a requested frequency. The wiring groups which are not used can be powered off so that the power consumption can be reduced.

The invention is not limited to the aforementioned embodiment, but it may be changed suitably without departing the scope of the invention.

While certain embodiments have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the spirit of the invention. The accompanying claims and their equivalents are intended to cover such forms or modifications as would fall within the scope and sprit of the invention.

What is claimed is:

1. A method for implementing a circuit design for an integrated circuit, the method comprising:
    (a) obtaining a first wiring to satisfy a given operating frequency;
    (b) calculating a maximum bypass wiring length based on the given operating frequency and a critical path of the first wiring;
    (c) obtaining a second wiring by bypassing the first wiring using wires other than wires of the first wiring in a first wiring group including the first wiring, wherein wiring of the integrated circuit is categorized into a plurality of wiring groups, and the first wiring is included in the first wiring group of the categorized wiring groups; and
    (d) replacing, using a computer, the first wiring with the second wiring, if a difference between the second wiring and the first wiring is not larger than the maximum bypass wiring length, and not replacing the first wiring with the second wiring if said difference is larger than the maximum bypass wiring length.

2. The method of claim 1, wherein step (c) is not performed and the first wiring is not replaced with the second wiring if the maximum bypass wiring length is smaller than a length corresponding to two sides of a logical block of the integrated circuit.

3. The method of claim 1, further comprising:
    (e) updating the maximum bypass wiring length based on the difference between the second wiring and the first wiring, when replacing the first wiring with the second wiring; and
    (f) bypassing a third wiring using wires other than wires of the third wiring in a second wiring group including the third wiring, wherein the third wiring is included in the second wiring group of the categorized wiring groups, if the updated maximum bypass wiring length is larger than a length corresponding to two sides of a logical block of the integrated circuit.

4. The method of claim 1, further comprising:
    (e) updating the maximum bypass wiring length based on the difference between the second wiring and the first wiring, when replacing the first wiring with the second wiring;
    (f) calculating a critical path of the second wiring, and updating the maximum bypass wiring length based on the given operating frequency and the calculated critical path of the second wiring, if the updated maximum bypass wiring length is smaller than a length corresponding to two sides of a logical block of the integrated circuit; and
    (g) bypassing a third wiring using wires other than wires of the third wiring in a second wiring group including the third wiring, wherein the third wiring is included in the second wiring group of the categorized wiring groups, if the updated maximum bypass wiring length is larger than a length corresponding to two sides of a logical block of the integrated circuit.

5. The method of claim 1, wherein step (c) is not performed and the first wiring is not replacing with the second wiring, when the number of wires (I) not used for the first wiring in the first wiring group is one or more, and a number of wires of the first wiring group is smaller than that of any other wiring group, and the maximum bypass wiring length is I times as large as two sides of a logical block of the integrated circuit.

6. The method of claim 1, further comprising:
    (e) counting how many times the first wiring is not replaced with the second wiring due to a fact that the difference between the second wiring and the first wiring is larger than the maximum bypass wiring length,
    wherein step (c) is not performed and the first wiring is not replaced with the second wiring when a number of counting exceeds a given value.

7. The method of claim 1, wherein wiring groups subjected to step (c) are predetermined, and one of said wiring groups is the first wiring group.

8. A non-transitory computer-readable medium storing a program causing a computer to execute operations for implementing a circuit design for an integrated circuit, the operations comprising:
    (a) obtaining a first wiring to satisfy a given operating frequency;
    (b) calculating a maximum bypass wiring length based on the given operating frequency and a critical path of the first wiring;
    (c) obtaining a second wiring by bypassing the first wiring using wires other than wires of the first wiring in a first wiring group including the first wiring, wherein wiring of the integrated circuit is categorized into a plurality of wiring groups, and the first wiring is included in the first wiring group of the categorized wiring groups; and
    (d) replacing the first wiring with the second wiring, if a difference between the second wiring and the first wiring is not larger than the maximum bypass wiring length, and not replacing the first wiring with the second wiring if said difference is larger than the maximum bypass wiring length.

* * * * *